(12) United States Patent
Halder et al.

(10) Patent No.: US 12,665,607 B2
(45) Date of Patent: Jun. 23, 2026

(54) ADC ARCHITECTURE INCORPORATING CONTINUOUS-TIME QUANTIZER

(71) Applicant: TEXAS INSTRUMENTS INCORPORATED, Dallas, TX (US)

(72) Inventors: Tanmay Halder, Bangalore (IN); Anand Subramanian, Bangalore (IN); Anand Kannan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 161 days.

(21) Appl. No.: 18/496,436

(22) Filed: Oct. 27, 2023

(65) Prior Publication Data

US 2025/0030431 A1 Jan. 23, 2025

(30) Foreign Application Priority Data

Jul. 23, 2023 (IN) .............................. 202341050676

(51) Int. Cl.
*H03M 1/06* (2006.01)
*H03M 1/08* (2006.01)
(52) U.S. Cl.
CPC ..................................... *H03M 1/08* (2013.01)
(58) Field of Classification Search
CPC ................................ H03M 1/08; H03M 3/464
See application file for complete search history.

(56) References Cited

U.S. PATENT DOCUMENTS

| | | | | |
|---|---|---|---|---|
| 6,577,257 B2 * | 6/2003 | Brooks | ............... | H03M 1/0641 341/131 |
| 7,564,389 B1 * | 7/2009 | Byrd | ........................ | H03M 3/39 341/143 |
| 8,031,098 B1 * | 10/2011 | Ebner | ................. | H03M 1/1061 341/146 |
| 8,274,415 B2 * | 9/2012 | Ihs | ......................... | H03M 3/344 341/143 |
| 9,325,337 B1 * | 4/2016 | Dempsey | .............. | H03M 1/109 |
| 9,455,737 B1 * | 9/2016 | Rajaee | .................. | H03M 3/464 |
| 11,088,704 B2 * | 8/2021 | Chen | ..................... | H03M 3/394 |
| 11,626,885 B1 * | 4/2023 | Liu | ........................ | H03M 3/426 341/143 |
| 2007/0040718 A1 * | 2/2007 | Lee | ........................ | H03M 3/332 341/143 |
| 2011/0032132 A1 * | 2/2011 | Lin | ........................ | H03M 3/424 341/143 |
| 2016/0149585 A1 * | 5/2016 | Watanabe | ............. | H03M 3/328 341/143 |

(Continued)

*Primary Examiner* — Jean B Jeanglaude

(74) *Attorney, Agent, or Firm* — Xianghui Huang; Frank D. Cimino

(57) ABSTRACT

In some examples, a circuit includes a first integrator having an input and an output. The circuit also includes a switching architecture having first and second terminals, the first terminal of the switching architecture coupled to the output of the first integrator. The circuit also includes a second integrator having an input and an output, the input of the second integrator coupled to the second terminal of the switching architecture. The circuit also includes a quantizer having an input and an output, the input of the quantizer coupled to the output of the second integrator. The circuit also includes a digital processing circuit having an input and an output, the input of the digital processing circuit coupled to the output of the quantizer.

19 Claims, 3 Drawing Sheets

(56) References Cited

U.S. PATENT DOCUMENTS

| | | | | |
|---|---|---|---|---|
| 2021/0184691 | A1* | 6/2021 | Tripathi | ............... H03M 3/424 |
| 2023/0208435 | A1* | 6/2023 | Makinwa | ............. H03M 3/342 |
| | | | | 341/143 |

* cited by examiner

206

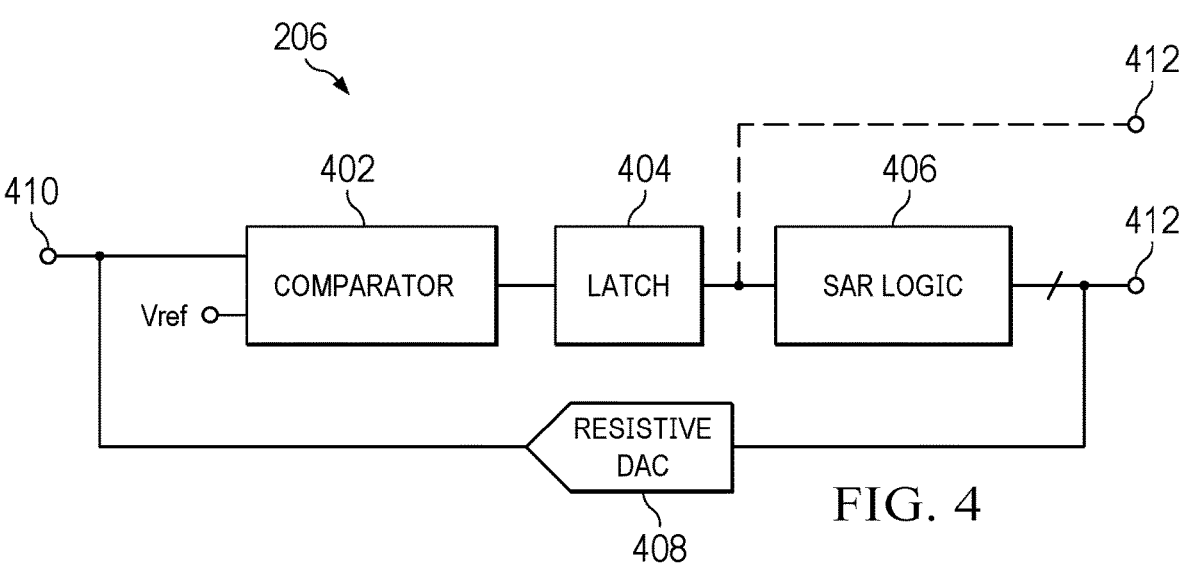

410    412

402          404          406    412

Vref    COMPARATOR    LATCH    SAR LOGIC

RESISTIVE DAC

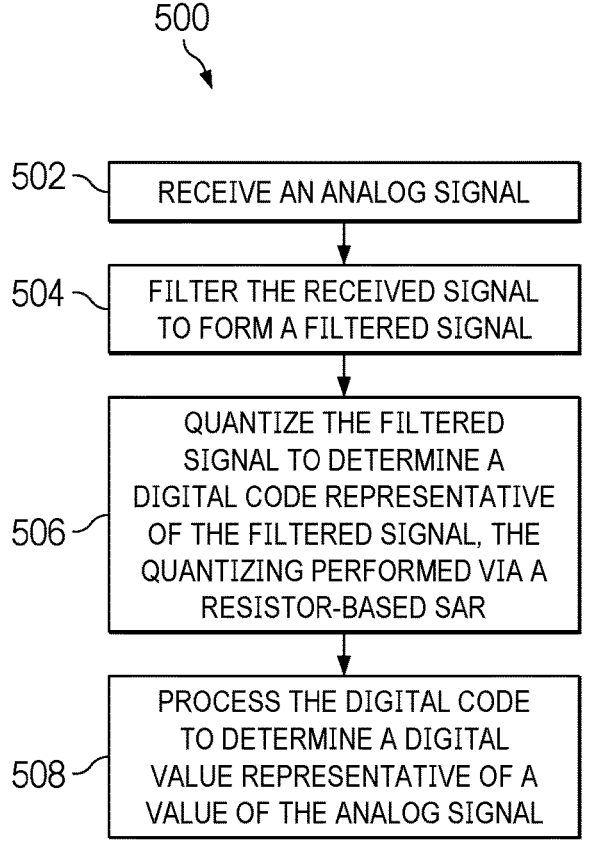

502 — RECEIVE AN ANALOG SIGNAL

504 — FILTER THE RECEIVED SIGNAL TO FORM A FILTERED SIGNAL

506 — QUANTIZE THE FILTERED SIGNAL TO DETERMINE A DIGITAL CODE REPRESENTATIVE OF THE FILTERED SIGNAL, THE QUANTIZING PERFORMED VIA A RESISTOR-BASED SAR

508 — PROCESS THE DIGITAL CODE TO DETERMINE A DIGITAL VALUE REPRESENTATIVE OF A VALUE OF THE ANALOG SIGNAL

FIG. 5

ADC ARCHITECTURE INCORPORATING CONTINUOUS-TIME QUANTIZER

CROSS-REFERENCE TO RELATED APPLICATIONS

The present application claims priority to India Provisional Patent Application No. 202341050676, which was filed Jul. 27, 2023, is titled "CONTINUOUS-TIME DELTA SIGMA ADC INCORPORATING CONTINUOUS-TIME QUANTIZER," and is hereby incorporated herein by reference in its entirety.

BACKGROUND

An analog-to-digital converter (ADC) receives a signal in an analog domain and provides a digital code representative of a value of the signal. Various architectures exist for converting an analog signal value into a digital code representative of that value, and various considerations can affect the suitability of a particular architecture for a particular use case.

SUMMARY

In some examples, a circuit includes a first integrator having an input and an output. The circuit also includes a switching architecture having first and second terminals, the first terminal of the switching architecture coupled to the output of the first integrator. The circuit also includes a second integrator having an input and an output, the input of the second integrator coupled to the second terminal of the switching architecture. The circuit also includes a quantizer having an input and an output, the input of the quantizer coupled to the output of the second integrator. The circuit also includes a digital processing circuit having an input and an output, the input of the digital processing circuit coupled to the output of the quantizer.

In some examples, a circuit includes a first integrator having first and second inputs and first and second outputs. The circuit also includes a switching architecture having first and second inputs and first and second outputs, the first input of the switching architecture coupled to the first output of the first integrator, and the second input of the switching architecture coupled to the second output of the first integrator. The circuit also includes a second integrator having first and second inputs and first and second outputs, the first input of the second integrator coupled to the switching architecture first output and the second input of the second integrator coupled to the switching architecture second output. The circuit also includes a quantizer having first and second inputs and a digital output, the first input of the quantizer coupled to the first output of the second integrator, and the second input of the quantizer coupled to the second output of the second integrator. The circuit also includes a digital processing circuit having an input and an output, the input of the digital processing circuit coupled to the digital output of the quantizer.

In some examples, a method includes receiving an analog signal. The method also includes filtering the received signal to form a filtered signal. The method also includes quantizing the filtered signal to determine a digital code representative of the filtered signal, the quantizing performed via a resistor-based successive approximation register (SAR). The method also includes processing the digital code to determine a digital value representative of a value of the analog signal.

BRIEF DESCRIPTION OF THE DRAWINGS

FIG. 4 is a block diagram of an example of a quantizer.

FIG. 5 is a flow diagram of an example method.

DETAILED DESCRIPTION

Figures 1, 2:
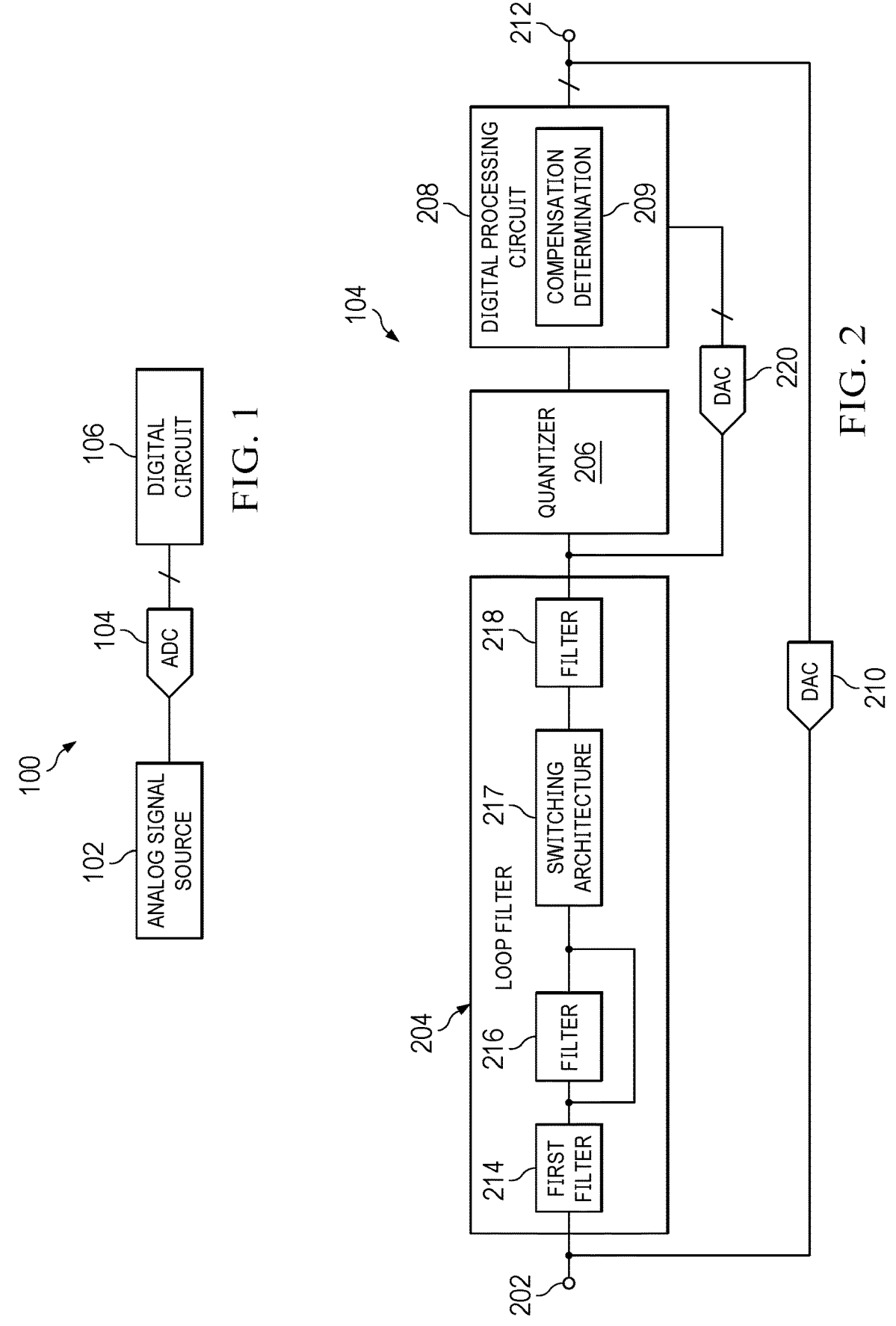
FIG. 1 is a block diagram of an example system.
FIG. 2 is a block diagram of an example of an analog-to-digital converter (ADC).

As described above, an analog-to-digital converter (ADC) receives a signal in an analog domain and provides a digital code representative of a value of the signal. In many use cases, a relevant consideration in determining suitability of an ADC for a particular use case is the size of the ADC, power consumption of the ADC, and resolution of the ADC. One ADC architecture that has been shown to have a resolution suitable for many applications is a sigma-delta ADC. A sigma-delta ADC filters, or integrates, the difference between the received analog signal and a feedback signal and then samples the filtered signal to provide a digital value representative of the analog signal. In some examples, the sampling is performed via a quantizer. The quantizer provides these digital values determined over time to digital processing circuitry, such as a digital filter, digital decimator, and the like, for processing. The digital processing circuitry in turn provides a digital code determined based on the received digital values as an output signal of the sigma-delta ADC.

Generally, a resolution of the quantizer is closely related to a quality and resolution of the sigma-delta ADC. However, as a resolution of the quantizer increases, so too does an amount of area and an amount of power consumed by the sigma-delta ADC. For example, many quantizers include a capacitor-based sample-and-hold circuit for sampling a value of the filtered signal, as well as a capacitive digital-to-analog converter (DAC) for providing the feedback signal used in determining the digital value representative of the sampled and held signal. However, these capacitor-based circuits may be comparatively large in area and power consumption when compared to other circuits, such as transistor-based circuits or resistor-based circuits.

Examples of this description provide for a continuous-time sigma-delta ADC (referred to in shorthand hereinafter as "ADC") that lacks the above-described capacitive circuits. In some examples, the ADC includes a switching architecture that provides a sample-and-hold functionality. The switching architecture may be implemented in place of the above-described capacitor-based sample-and-hold circuit, and without the inclusion of capacitors, thereby reducing a size and power consumption incurred in providing the sample-and-hold functionality. In some examples, a quantizer of the ADC includes a DAC implemented as a resistor ladder (e.g., a R-2R ladder). Such a DAC may be referred to as a R-2R DAC. The R-2R DAC may be implemented in place of the above-described capacitive DAC, and without the inclusion of capacitors, thereby reducing a size and power consumption incurred in providing the DAC functionality. In some examples, exclusion of capacitors in the manner described above may also reduce a delay between the ADC receiving an analog signal and the ADC providing a digital code representative of a value of the analog signal. Such a solution may also consume less space than a capacitor-based approach, reducing a cost of the ADC and making the ADC suitable for implementation in a wider range of application environments. For example, by implementing the ADC according to architectures other than the above-described capacitive circuits, charge and discharges times of the capacitive circuits, which may contribute to delay, are avoided.

FIG. 1 is a block diagram of an example system 100. In some examples, the system 100 is representative of a computing device, such as a laptop computer, a server, a networking device, a smartphone, a tablet device, or the like. In other examples, the system 100 is representative of a transportation device, such as a vehicle suitable for operation on one or more of air, land, or sea. In yet other examples, the system 100 is representative of an audio system. In an example, the system 100 includes an analog signal source 102, an ADC 104, and a digital circuit 106. In some examples, the analog signal source 102 may be any device which outputs an analog signal, such as a microphone, a transducer, a sensor, or the like. In other examples, the analog signal source 102 may be a terminal (e.g., microphone input line, etc.) that receives an analog signal from another device. The digital circuit 106 may be any circuit operating in a digital domain that receives digital signals (or digital codes) and processes, manipulates, stores, or otherwise interacts with those digital signals. The analog signal source 102 has an output coupled to an input of the ADC 104. The ADC 104 has an output coupled to an input of the digital circuit 106. In some examples, the ADC 104 communicates multiple bits of digital data via the coupling between the ADC 104 and the digital circuit 106. In other examples, the ADC 104 has multiple outputs and the digital circuit 106 has multiple inputs, where each output of the ADC 104 is coupled to a respective input of the digital circuit 106. In such an example, the ADC 104 may communicate a single bit of digital data per coupling between the ADC 104 and the digital circuit 106.

In an example, the ADC 104 receives an analog signal from the analog signal source 102. The ADC 104 filters the received signal via one or more low-pass filters (not shown) to integrate the received signal, forming and providing a filtered signal. In some examples, an order of the filtering determines a number of the low pass filters that successively filter the received signal to provide the filtered signal, where an increase in order corresponds, in some examples, to decreased noise in the filtered signal. In some examples, a last low-pass filter in the series of low pass filters may receive an output from each of the preceding low-pass filters and perform sampling and holding at the input of the last low-pass filter. The sampling and holding may be performed via a switching architecture that switches between providing a sum of output signals of each of the preceding low-pass filters to an input of the last low-pass filter, or providing a value of ground, or approximately no current, at the input of the last low-pass filter. In this way, the last low-pass filter performs filtering or integrating while the switching architecture is in a first state providing the sum of output signals of each of the preceding low-pass filters to the input of the last low-pass filter, and holds a value of an output signal provided by the last low-pass filter in response to the switching architecture providing the ground, or no current, signal at the input of the last low-pass filter.

The filtered signal is provided to a quantizer (not shown) for sampling to determine a digital code representative of a value of the filtered signal. In some examples, the quantizer includes a R-2R DAC. Successive approximation register (SAR) control logic (not shown) of the ADC 104 controls the R-2R ADC to provide a threshold signal. The quantizer compares a sum of the threshold signal and the filtered signal to a reference voltage (Vref). In this way, current addition or subtraction is performed between the threshold signal and the filtered signal, providing a current-based comparison in the quantizer. Responsive to the sum being less than Vref, the quantizer determines that a digital, or binary, value of 0 is representative of the value of the filtered signal. Responsive to the sum being greater than Vref, the quantizer determines a digital value of 1 is representative of the value of the filtered signal. The quantizer provides each determined digital value to a digital processing circuit (not shown).

In some examples, the digital processing circuit performs further processing on the digital value, or multiple digital values received over time, to determine an output signal of the ADC 104, the scope of which is not limited herein. For example. The digital processing circuit may perform filtering and digital decimation to average the digital values over a period of time to determine and provide the output signal of the ADC 104. In some examples, an output of the digital processing circuit is also added as feedback to the received signal prior to providing the received signal to the low-pass filters, as described above. In some examples, the digital processing circuit performs compensation, which is converted to an analog signal and summed with the filtered signal at an input of the quantizer. In other examples, a compensation architecture is included in a switching architecture coupled before the last low-pass filter. The compensation alters a noise transfer function of the filtered signal provided to the input of the quantizer, such as to mitigate adverse effects resulting from the input of the integrator being coupled to ground, or provided no current, for a period of time.

FIG. 2 is a block diagram of an example of the ADC 104. In some examples, the ADC 104 includes an input terminal 202, a loop filter 204, a quantizer 206, a digital processing circuit 208, a DAC 210, an output terminal 212, and a switching architecture 217. The loop filter 204 includes a first filter 214, an nth filter 216, and a last filter 218. In an example, each of the first filter 214, nth filter 216, and last filter 218 have a same filter architecture. For example, the first filter 214, nth filter 216, and last filter 218 are each implemented as integrators. In an example, the input terminal 202 is coupled to an output terminal of the DAC 210 and an input terminal of the loop filter 204 (e.g., an input terminal of the first filter 214). The first filter 214 has an output terminal coupled to an input terminal of the nth filter, as well as coupled to an input terminal of the switching architecture 217. The nth filter 216 has an output terminal coupled to the input terminal of the filter 218. Although shown as a single filter, the nth filter 216 is generally representative of any number of filters which may be present between the first filter 214 and the filter 218, where that number may be greater than or equal to zero. In some examples, a filter order of the loop filter 204 is determined based on a number of successive filters present in the loop filter 204. Each nth filter 216 may have an input terminal coupled to an output terminal of the immediately preceding filter, and an output terminal coupled to the input terminal of the switching architecture 217. The switching architecture 217 has an output terminal coupled to an input terminal of the filter 218. In some examples, although not shown in FIG. 2, the switching architecture 217 also has a second input terminal coupled to a ground terminal (not shown) at which a ground voltage potential is provided. The filter 218 has an output terminal coupled to an input terminal of the quantizer 206. The quantizer 206 has an output terminal coupled to an input terminal of the digital processing circuit 208. The digital processing circuit 208 has an output terminal coupled to the output terminal 212 and to an input terminal of the DAC 210.

In an example of operation of the ADC 104, the ADC 104 receives an analog signal at the input terminal 202. The analog signal is combined with an output signal (e.g., a feedback signal) of the DAC 210 to form a received signal, which is provided to the loop filter 204. The loop filter 204 receives the received signal and filters the received signal through a series of successive low-pass filtering operations. For example, the first filter 214 receives the received signal and performs a low-pass filtering to integrate the received signal, providing a first filtered signal. The first filter 214 provides the first filtered signal to the nth filter 216, which performs a low-pass filtering to integrate the first filtered signal a second time to form a nth filtered signal. Each filter (e.g., first filter 214 and each nth filter 216) of the loop filter 204 provides its output signal to the filter 218. A switching architecture 217 coupled to the filter 218 sums each of the received filtered signals (e.g., the first filtered signal and each nth filtered signal) and provides the resulting summed signal at an input of the filter 218 for a first period of time. The switching architecture subsequently provides no current at the input of the filter 218 for a second period of time following the first period of time. In some examples, the switching architecture 217 provides no current by providing a ground voltage potential at the input of the filter 218. In other examples, the switching architecture 217 provides approximately no current by forming a virtual ground at the input of the filter 218, such as by superimposing differential signals, as described below with respect to FIG. 3. Accordingly, the filter 218 performs low-pass filtering, or integration, of the summed signal for the first period of time. The filter 218 holds or maintains a current output value of the filter 218 beginning at the start of the second period of time and throughout a duration of the second period of time. In an example, the filter 218 provides this held value to the quantizer 206 as a filtered signal. In this way, the switching architecture facilitates a sample-and-hold or integrate-and-hold functionality of the filter 218.

The quantizer 206 receives the filtered signal and performs a comparison between the filtered signal and an output signal of a resistive DAC (not shown), such as a R-2R DAC, by summing currents of the filtered signal and the output signal of the resistive DAC. In some examples, the output signal of the resistive DAC has a value determined according to SAR logic (not shown) that controls the resistive DAC in a closed loop manner based on a binary search processing, such as a binary search algorithm, that receives an output signal of the quantizer 206 as its input. In an example, the SAR logic controls the resistive DAC to cause a sum of the filtered signal and the output of the resistive DAC to approximately equal zero. In some examples, the summation performed by the quantizer 206 forms a summed signal. The quantizer 206 compares the summed signal with Vref to determine a digital code representative of a value of the summed signal. The digital code is provided as an output signal of the quantizer 206, as well as provided to SAR logic for controlling the resistive DAC. In some examples, the digital code is provided to a latch (not shown) which stores the digital code and in turn provides the digital code as the output signal of the quantizer 206 and to SAR logic for controlling the resistive DAC.

In an example, the digital processing circuit 208 receives the digital code from the quantizer 206 and further processes, manipulates, stores, or otherwise interacts with the digital code, the scope of which is not limited herein. In some examples, the digital processing circuit 208 collects or accumulates multiple digital codes and performs filtering, decimation, averaging, or other operations on the digital code(s) to provide an output signal of the ADC 104 at the output terminal 212. In some examples, the digital processing circuit 208 also provides the output signal of the ADC 104 to the DAC 210 for providing a feedback signal for summation with the received analog signal, as described above.

In some examples, the ADC 104 further includes compensation functionality. For example, the digital processing circuit 208, via a compensation determination circuit 209, determines a variance between a noise transfer function of the digital code received from the quantizer 206 and a target noise transfer function. Based on the variance, the compensation determination circuit determines and provides a digital compensation code. A DAC 220 has an input coupled to a second output of the digital processing circuit 208 and an output coupled to the input of the quantizer 206. The DAC 220 receives the compensation code and converts the compensation code to an analog compensation signal. The DAC 220 provides the compensation signal at the input of the quantizer to sum the filtered signal with the compensation signal. In some examples, the compensation compensates for effects of the switching of the switching architecture 217, as described above. For example, the compensation may correct for errors or modifications introduced into a noise transfer function of the ADC 104 resulting from the holding of the filter 218. In some examples, the compensation may be merged or combined with another component, such as the switching architecture 217 to form the switching architecture 300, as described below with respect to FIG. 3. In such an example, the compensation determination circuit 209 and the DAC 220 may be omitted from the ADC 104.

The ADC 104 is shown in FIG. 2 as having a single-ended architecture. However, the ADC 104 may be implemented in a differential architecture in substantially the same manner as described above, where described couplings may be for a positive differential signal component and those couplings may be replicated to provide a signal path for a negative differential signal component. Both single-ended and differential architectures are encompassed within the scope of this disclosure.

Figure 3:
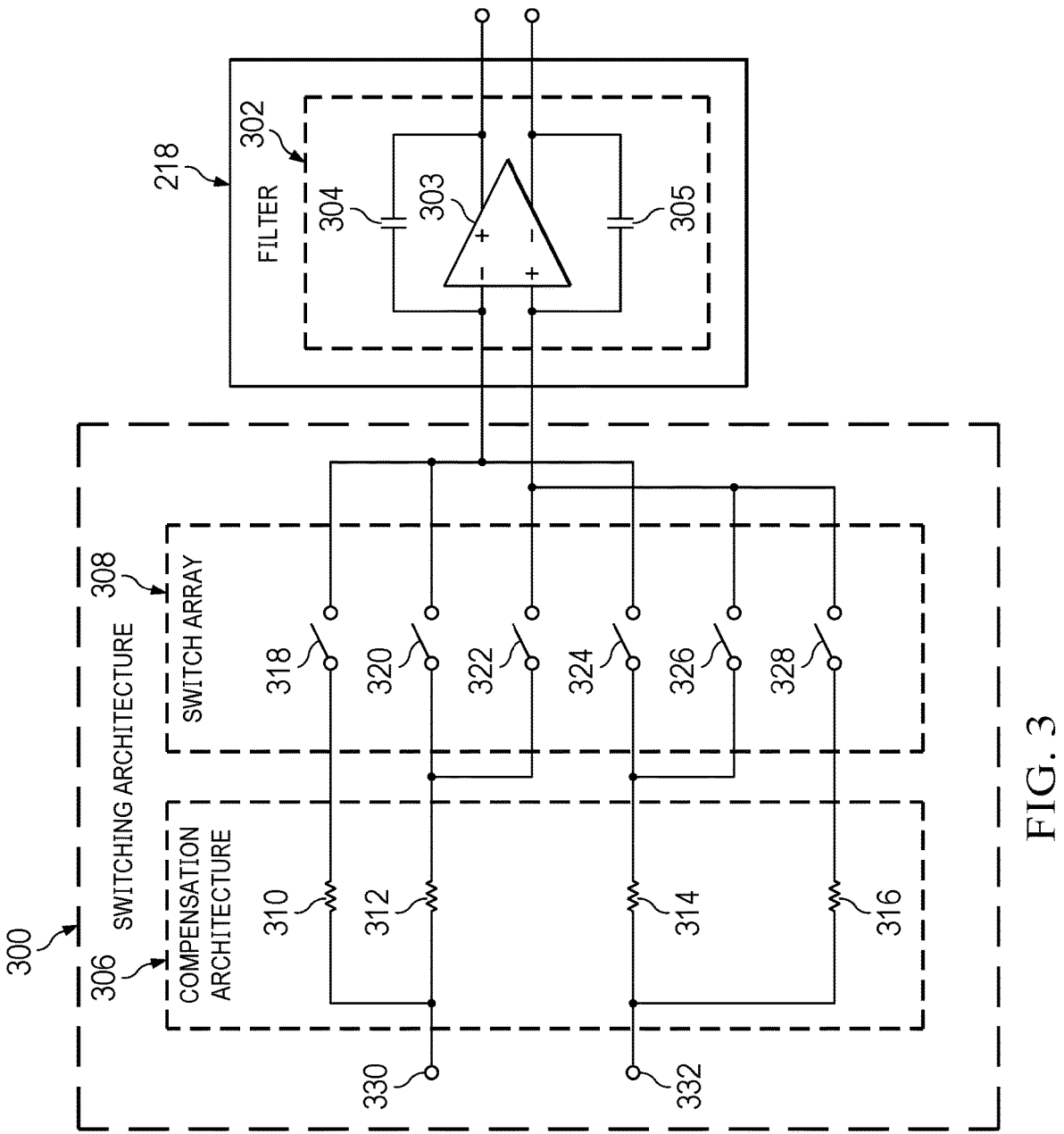
FIG. 3 is a block diagram of an example of a switched filter.

FIG. 3 is a block diagram of an example of the a switching architecture 300 and filter 214. The filter 214 as shown in FIG. 3 has a differential architecture. For example, the filter 204 includes an integrator 302 having a differential amplifier 303. A capacitor 304 is coupled between a first input and a first output of the differential amplifier 303. A capacitor 305 is coupled between a second input and a second output of the differential amplifier 303. In an example, the switching architecture 300 incorporates an example of the switching architecture 217 as a switch array 308 and provides the compensation described above via a compensation architecture 306. In an example, the compensation architecture 306 includes resistors 310, 312, 314, and 316. The switch array 308 includes switches 318, 320, 322, 324, 326, and 328 (collectively, switches 318-328). In some examples, the resistors 310, 312, 314, and 316 have resistance values selected such that an impulse response of the filter 218 corresponds to a particular, or target, noise transfer function that may be useful for a particular application environment of the ADC 104. Each of the switches 318-328 may be implemented according to any suitable architecture, such as transistors. For example, the switches 318-328 may be implemented as field effect transistors (FETs). The switches 318-328 may receive control signals from any suitable source, the scope of which is not limited herein. In some examples, at least some of the switches 318-328 receive control signals derived from a clock signal that may be provided in the ADC 104.

In an example, the resistor 310 has a first terminal coupled to an input terminal 330 of the switching architecture 304 and a second terminal coupled to a first terminal of the switch 318. The switch 318 has a second terminal coupled to a first input terminal (e.g., negative input terminal) of the filter 218. The resistor 312 has a first terminal coupled to the input terminal 330 and a second terminal coupled to a first terminal of the switch 320. The switch 320 has a second terminal coupled to the first input terminal of the filter 218. The switch 322 has a first terminal coupled to the second terminal of the resistor 312 and a second terminal coupled to a second input terminal (e.g., positive input terminal) of the filter 218. The resistor 314 has a first terminal coupled to an input terminal 332 of the switching architecture 304 and a second terminal coupled to a first terminal of the switch 324. The switch 324 has a second terminal coupled to the first input terminal of the filter 218. The switch 326 has a first terminal coupled to the second terminal of the resistor 314 and a second terminal coupled to the second input terminal of the filter 218. The resistor 316 has a first terminal coupled to the input terminal 332 and a second terminal coupled to a first terminal of the switch 328. The switch 328 has a second terminal coupled to the second input terminal of the filter 218. In an example, the input terminal 330 receives a positive component of a differential signal (such as provided by the first filter 214) and the input terminal 332 is receives a negative component of a differential signal (such as provided by the first filter 214). In some examples, each of the resistors 310-316 have approximately a same resistance value. In some examples, the switching architecture 304 is replicated for each filter in the loop filter 204 other than the last filter 218. In some examples, resistance values of the resistors of the compensation architecture 306 may vary from one instance of the switching architecture 304 to another instance of the switching architecture 304.

In some examples, the switches 318, 328 may be controlled to be in a conductive state at substantially all times the filter 218 is operational. The switches 320, 326 may receive a first control signal and the switches 322, 324 may receive a second control signal. In some examples, the first and second control signals are substantially opposite in value. Responsive to the first control signal having an asserted value, the positive component of the differential signal is provided at the first input of the filter 218 and the negative component of the differential signal is provided at the second input of the filter 218. During this time (e.g., a first period of time, as described above), the filter 218 filters, or integrates, the received signal to provide a filtered signal. Responsive to the second control signal having an asserted value, the positive component of the differential signal is provided at the first and second inputs of the filter 218 and the negative component of the differential signal is provided at the first and second inputs of the filter 218. Because the first and second components of the differential signal are substantially inverse in nature with respect to one another, providing both the positive and negative components of the differential signal at each input of the filter 218 results in substantially no current flowing into either input of the filter 218, as described above. This may be considered a virtual ground and may cause the filter 218 to hold its value for a second period of time, as described above, until the first control signal again has an asserted value.

FIG. 4 is a block diagram of an example of the quantizer 206. In an example, the quantizer 206 includes a comparator 402, a latch 404, SAR logic 406, and a R-2R DAC 408. In some examples, the comparator 402 is a current comparator. In an example, the quantizer 206 has an input terminal 410 that receives a filtered signal, such as provided by the loop filter 204, as described above. The comparator 402 has a first input coupled to the input terminal 410, a second input that receives Vref, and an output. The latch 404 has an input coupled to the output of the comparator 402, and has an output. The SAR logic 406 has an input coupled to the output of the latch 404, and has an output. The R-2R DAC 408 has an input coupled to the output of the SAR logic 406, and has an output coupled to the first input of the comparator 402. In some examples, the quantizer 206 has an output terminal 412 coupled to the output of the latch 404. In other examples, the quantizer 206 has an output terminal 412 coupled to the output of the SAR logic 406. In such an example, the SAR logic 406 may process bit values received from the latch 404 to digitally combine the bit values to form an output signal of the quantizer 206. In an example, the quantizer 206 is, or functions as, a continuous time (CT) SAR circuit. The quantizer 206 may be referred to as CT because the quantizer 206 does not include sample and hold circuitry for sampling an input signal received by the quantizer 206.

In an example of operation of the quantizer 206, the filtered signal is received at the input terminal 410. The filtered signal is summed with an output of the R-2R DAC 408, and a resulting summed signal provided at the first input of the comparator 402. The comparator 402 compares the summed signal to Vref received at a reference voltage terminal and provides a digital code having a value determined based on the comparison. In some examples, the comparator 402 converts Vref to a reference current (Iref) for comparison to the summed signal, where Iref has a value proportional to Vref divided by a resistance of the R-2R DAC 408. Responsive to the summed signal having a value less than Vref, the comparator 402 provides a digital code having a value of 0 as being representative of the value of the filtered signal. Responsive to the summed signal having a value greater than or equal to Vref, the comparator 402 provides a digital code having a value of 1 as being representative of the value of the filtered signal.

The comparator 402 provides the digital code to the latch 404, which stores the digital code. The latch 404 also provides the digital code to the SAR logic 406. Based on a value of the digital code, the SAR logic 406 controls the R-2R DAC 408. The SAR logic 406 may control the R-2R DAC 408 based on a binary search processing, such as a binary search algorithm, the scope of which is not limited herein. Based on the control of the SAR logic 406, a resistance of the R-2R DAC 408 changes, modifying a current flowing through the R-2R DAC 408 and correspondingly modifying a value of the summed signal provided at the first input of the comparator 402. Although not shown in FIG. 4, in some examples, at least some components of the quantizer 206 are clocked components. In some examples, the SAR logic 406 provides the clock signal. In some examples, the latch 404 provides the digital code to the output terminal 412 for output by the quantizer 206. In other examples, the SAR logic 406 provides the digital code to the output terminal 412 for output by the quantizer 206.

FIG. 5 is a flow diagram of an example method 500. In some examples, the method 500 is implemented by a circuit, such as the ADC 104, to provide a digital signal, value, or code having a value representative of a value of a received analog signal.

At operation 502, an analog signal is received. In various examples, the analog signal may be single-ended or differential in nature. The analog signal may be received from any suitable analog signal source, the scope of which is not limited herein. In some examples, the analog signal is a signal from an analog signal source that is combined (e.g., summed) with a feedback signal of the circuit to form the received signal.

At operation 504, the received signal is filtered to form a filtered signal. In some examples, the filtering is performed via a successive series of low-pass filters. In some examples, the filtering integrates the received signal to form the filtered signal. In some examples, a final filter of the successive series of filters is a switched filter, such as the filter 218 described above, switched via the switching architecture 217 or 300. The switching architecture, as described above, facilitates the switched filter implementing a sample and hold functionality without including a sampling capacitor or dedicated sample and hold circuit, such as a latch.

At operation 506, the filtered signal is quantized to determine a digital code representative of the filtered signal. In some examples, the quantizing is performed by a quantizer. In some examples, the quantizer is implemented via a R-2R DAC controlled by SAR logic, as described above. As such, in some examples, the quantizer does not include a capacitor array, ladder, or other capacitive structure for use in determining or providing a signal estimating a value of the filtered signal.

At operation 508, the digital code is processed to determine a digital value representative of a value of the analog signal. In some examples, the processing is performed by the digital processing circuit 208. In some examples, the digital code is processed by averaging multiple digital codes over a period of time. The averaging may be performed according to any suitable process, the scope of which is not limited herein. In some examples, the digital value is provided to a DAC which converts the value from a digital domain to an analog domain for combining with the analog signal received at operation 502, as described above.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A circuit, comprising:
a first integrator having an input and an output;
a switching architecture having first and second terminals, the first terminal of the switching architecture coupled to the output of the first integrator;
a second integrator having an input and an output, the input of the second integrator coupled to the second terminal of the switching architecture;
a quantizer having an input and an output, the input of the quantizer coupled to the output of the second integrator, wherein the quantizer includes:
   a comparator having first and second inputs, and an output, the first input of the comparator coupled to the input of the quantizer, and the second input of the comparator coupled to a reference voltage terminal;
   a latch having an input and an output, the input of the latch coupled to the output of the comparator;

a successive approximation register (SAR) circuit having an input and an output, the input of the SAR circuit coupled to the output of the latch, the output of the SAR circuit coupled to the output of the quantizer; and a R-2R digital-to-analog converter (DAC) having an input and an output, the input of the R-2R DAC coupled to the output of the SAR circuit, and the output of the R-2R DAC coupled to the first input of the comparator; and a digital processing circuit having an input and an output, the input of the digital processing circuit coupled to the output of the quantizer.

2. The circuit of claim 1, further comprising a third integrator having an input and an output, the input of the third integrator coupled to the output of the first integrator, and the output of the third integrator coupled to the first terminal of the switching architecture.

3. The circuit of claim 1, wherein the SAR circuit is a continuous time (CT) SAR circuit.

4. The circuit of claim 1, further comprising a digital-to-analog converter (DAC) having an input and an output, the input of the DAC coupled to the output of the digital processing circuit, and the output of the DAC coupled to the input of the first integrator.

5. A circuit, comprising:

a first integrator having first and second inputs and first and second outputs;

a switching architecture having first and second inputs and first and second outputs, the first input of the switching architecture coupled to the first output of the first integrator, and the second input of the switching architecture coupled to the second output of the first integrator;

a second integrator having first and second inputs and first and second outputs, the first input of the second integrator coupled to the first output of the switching architecture and the second input of the second integrator coupled to the second output of the switching architecture;

a quantizer having first and second inputs and a digital output, the first input of the quantizer coupled to the first output of the second integrator, and the second input of the quantizer coupled to the second output of the second integrator, wherein the quantizer comprises:

a comparator having first, second, and third inputs, and an output, the first input of the comparator coupled to the first input of the quantizer, the second input of the comparator coupled to the second input of the quantizer, and the third input of the comparator coupled to a reference voltage terminal;

a latch having an input and an output, the input of the latch coupled to the output of the comparator;

a successive approximation register (SAR) circuit having an input and an output, the input of the SAR circuit coupled to the output of the latch, the output of the SAR circuit coupled to the digital output of the quantizer; and a R-2R digital-to-analog converter (DAC) having an input and first and second outputs, the input of the R-2R DAC coupled to the output of the SAR circuit, the first output of the R-2R DAC coupled to the first input of the comparator, and the second output of the R-2R DAC coupled to the second input of the comparator; and a digital processing circuit having an input and an output, the input of the digital processing circuit coupled to the digital output of the quantizer.

6. The circuit of claim 5, wherein the SAR circuit is a continuous time (CT) SAR circuit.

7. The circuit of claim 5, further comprising a third integrator having first and second inputs and first and second outputs, the first input of the third integrator coupled to the first output of the first integrator, and the second input of the third integrator coupled to the second output of the first integrator, wherein the switching architecture has third and fourth inputs, the third input of the switching architecture coupled to the first output of the third integrator, and the fourth input of the switching architecture coupled to the second output of the third integrator.

8. The circuit of claim 7, further comprising:

a first resistor having first and second terminals, the first terminal of the first resistor coupled to the first output of the third integrator;

a second resistor having first and second terminals, the first terminal of the second resistor coupled to the first output of the third integrator;

a third resistor having first and second terminals, the first terminal of the third resistor coupled to the second output of the third integrator;

a fourth resistor having first and second terminals, the first terminal of the third resistor coupled to the second output of the third integrator;

a first switch having first and second terminals, the first terminal of the first switch coupled to the second terminal of the first resistor, and the second terminal of the first switch coupled to the first input of the second integrator;

a second switch having first and second terminals, the first terminal of the second switch coupled to the second terminal of the second resistor, and the second terminal of the second switch coupled to the first input of the second integrator;

a third switch having first and second terminals, the first terminal of the third switch coupled to the second terminal of the second resistor, and the second terminal of the third switch coupled to the second input of the second integrator;

a fourth switch having first and second terminals, the first terminal of the fourth switch coupled to the second terminal of the third resistor, and the second terminal of the fourth switch coupled to the first input of the second integrator;

a fifth switch having first and second terminals, the first terminal of the fifth switch coupled to the second terminal of the third resistor, and the second terminal of the fifth switch coupled to the second input of the second integrator; and a sixth switch having first and second terminals, the first terminal of the sixth switch coupled to the second terminal of the fourth resistor, and the second terminal of the sixth switch coupled to the second input of the second integrator.

9. The circuit of claim 5, further comprising:

a first resistor having first and second terminals, the first terminal of the first resistor coupled to the first output of the first integrator;

a second resistor having first and second terminals, the first terminal of the second resistor coupled to the first output of the first integrator;

a third resistor having first and second terminals, the first terminal of the third resistor coupled to the second output of the first integrator;

a fourth resistor having first and second terminals, the first terminal of the third resistor coupled to the second output of the first integrator;

a first switch having first and second terminals, the first terminal of the first switch coupled to the second terminal of the first resistor, and the second terminal of the first switch coupled to the first input of the second integrator;

a second switch having first and second terminals, the first terminal of the second switch coupled to the second terminal of the second resistor, and the second terminal of the second switch coupled to the first input of the second integrator;

a third switch having first and second terminals, the first terminal of the third switch coupled to the second terminal of the second resistor, and the second terminal of the third switch coupled to the second input of the second integrator;

a fourth switch having first and second terminals, the first terminal of the fourth switch coupled to the second terminal of the third resistor, and the second terminal of the fourth switch coupled to the first input of the second integrator;

a fifth switch having first and second terminals, the first terminal of the fifth switch coupled to the second terminal of the third resistor, and the second terminal of the fifth switch coupled to the second input of the second integrator; and a sixth switch having first and second terminals, the first terminal of the sixth switch coupled to the second terminal of the fourth resistor, and the second terminal of the sixth switch coupled to the second input of the second integrator.

10. The circuit of claim 9, wherein the quantizer is configured to:

receive a second integrator output signal via the first and second inputs of the quantizer;

determine, via the SAR circuit, a digital value representative of the second integrator output signal; and provide the digital value representative of the second integrator output signal to the digital processing circuit.

11. The circuit of claim 10, wherein the switching architecture is configured to perform compensation of a noise transfer function of the second integrator output signal based on the first through fourth resistors, the compensation to compensate for a second integrator input signal having a value held at zero for a period of time.

12. The circuit of claim 5, wherein the first integrator comprises:

a first differential amplifier having first and second inputs and first and second outputs, in which the first input of the first differential amplifier is the first input of the first integrator, the second input of the first differential amplifier is the second input of the first integrator, the first output of the first differential amplifier is coupled to the first input of the switching architecture, and the second output of the first differential amplifier is coupled to the second input of the switching architecture, and wherein the second integrator comprises-:

a second differential amplifier having first and second inputs and first and second outputs, in which the first input of the second differential amplifier is coupled to the first output of the switching architecture, the second input of the second differential amplifier is coupled to the second output of the switching architecture, the first output of the second differential amplifier is coupled to the first input of the quantizer, and the second output of the second differential amplifier is coupled to the second input of the quantizer.

13. The circuit of claim 5, further comprising a digital-to-analog converter (DAC) having an input and an output, the input of the DAC coupled to the output of the digital processing circuit, and the output of the DAC coupled to the first integrator.

14. A method, comprising:

receiving an analog signal;

filtering the received signal to form a filtered signal;

quantizing the filtered signal to determine a digital code representative of the filtered signal, the quantizing performed via a resistor-based successive approximation register (SAR) circuit without providing a reference value via a capacitor array; and processing the digital code to determine a digital value representative of a value of the analog signal.

15. The method of claim 14, wherein the resistor-based SAR circuit is a resistor-based continuous time (CT) SAR circuit.

16. The method of claim 14, further comprising combining the analog signal with a feedback signal to form the received signal.

17. The method of claim 14, wherein the filtering integrates the received signal to form the filtered signal.

18. The method of claim 14, further comprising providing the received signal to a filter for a first period of time and providing no net current flow to the filter for a second period of time to form the filtered signal.

19. The method of claim 14, wherein the quantizing is performed by a quantizer including a R-2R digital-to-analog converter (DAC).

* * * * *